United States Patent [19]
Ito et al.

[11] 3,981,764
[45] Sept. 21, 1976

[54] III-V COMPOUND SEMI-CONDUCTOR CRYSTAL GROWTH FROM A LIQUID PHASE ON A SUBSTRACT INCLUDING FILTERING LIQUID PHASE

[75] Inventors: Kazuhiro Ito, Tokyo; Masao Kawamura, Fuchu; Yuichi Ono; Makoto Morioka, both of Tokyo, all of Japan

[73] Assignee: Hitachi, Ltd., Japan

[22] Filed: June 25, 1975

[21] Appl. No.: 590,336

[30] Foreign Application Priority Data
Aug. 12, 1974 Japan.............................. 49-91553

[52] U.S. Cl......................... 156/622; 156/DIG. 70; 156/DIG. 61; 148/172; 118/415; 423/87; 423/122

[51] Int. Cl.²................... B01J 17/20; C01B 19/00; C01B 27/00; C01F 7/00

[58] Field of Search .......... 156/621, 622, 623, 624, 156/DIG. 70, DIG. 61; 23/273 SP; 118/412, 422, 415; 423/87, 122; 148/172

[56] References Cited
UNITED STATES PATENTS

| | | |
|---|---|---|
| 3,551,219 | 12/1970 | Parrish.............................. 156/622 |
| 3,677,228 | 6/1972 | Parrish.............................. 118/422 |
| 3,690,965 | 9/1972 | Bergh................................ 156/622 |
| 3,762,367 | 10/1973 | Nishizawa......................... 118/422 |
| 3,767,481 | 10/1973 | Ettenberg.......................... 156/622 |
| 3,792,682 | 2/1974 | Phipps.............................. 118/415 |
| 3,896,765 | 7/1975 | Ariga................................ 118/412 |

FOREIGN PATENTS OR APPLICATIONS

2,233,734   1/1973   Germany .......................... 156/622

OTHER PUBLICATIONS

Blum et al., IBM Tech. Disclosure Bulle., vol. 13, No. 11, Apr., 1971, p. 3221.
DeGelormo, IBM Tech. Discl. Bulle., vol. 16, No. 7, Dec., 1973, p. 2158.

*Primary Examiner*—Stephen J. Emery
*Attorney, Agent, or Firm*—Craig & Antonelli

[57] ABSTRACT

In an epitaxial growth method in liquid phase for III–V compound semiconductor crystals a solution for crystal growth is at first heated to a temperature which is higher than the temperature of crystal growth, and then cooled to that temperature, whereby a part of the solution crystallizes out as small crystals. This solution is separated by means of a filter means into two parts, one of which contains the small crystals and the other of which does not. A substrate crystal is brought into contact with the latter.

6 Claims, 7 Drawing Figures

III-V COMPOUND SEMI-CONDUCTOR CRYSTAL GROWTH FROM A LIQUID PHASE ON A SUBSTRACT INCLUDING FILTERING LIQUID PHASE

BACKGROUND OF THE INVENTION

1. Field of the Invention

The present invention relates to a method and an apparatus for crystal growth wherein it becomes possible to regulate to a certain degree the composition and the impurity concentration in a crystal layer grown epitaxially in a liquid phase.

2. Description of the Prior Art

In a crystal growth process in a liquid phase, in the case where the crystal substance to be grown contains a constituent element having a segregation coefficient greater than 1, the concentration of the constituent element in the grown crystal layer decreases in the direction of growth. It is evident that the greater the segregation coefficient of the constituent element, the more prominent this tendency becomes. Some crystals showing the tendency described above are many of the mixed crystals of the III − V compound semiconductors such as $Ga_{1-x}Al_xAs$ ($x$ representing a mixing proportion), $GaAs_{1-x}P_x$, $Ga_{1-x}Al_xP$, $In_{1-x}Al_xAs$, and so on. In particular when a thick grown crystal layer of such substances is needed, variations in the composition of the layer, i.e. variations of the mixing ratio in the direction of growth provoke bending, cracking and so forth due to differences in lattice constants and variations in thermal expansion coefficients. When such a grown crystal layer is used for fabricating light emitting diodes, these variations often give rise to fluctuations in the wavelength of emitted light, fluctuations in the transmission of emitted light, and fluctuations in electrical properties as well. This naturally decreases the yield rate of fabrication of these diodes.

It is very advantageous from an industrial point of view to remove these difficulties by maintaining a predetermined mixing ratio or by keeping concentration of impurities constant over the whole thickness of the grown crystal layer.

In order to remove these difficulties, a method has been proposed, in which a temperature gradient is formed in a solution for crystal growth. The procedure for this method is hereinafter briefly described. A solution for crystal growth is heated at first to a temperature higher than that necessary for the beginning of crystal growth. Then the solution is cooled to the temperature necessary for the beginning of crystal growth. During this period of time small solid crystals form in the solution. The temperature is highest at the upper surface of the solution, and decreases gradually downward. A substrate crystal is placed at the bottom of the solution where the temperature is lowest. The small solid crystals are dissolved again in the solution due to the presence of the temperature gradient. The solute coming from the small solid crystals is transported by diffusion toward the substrate crystal and participate in an epitaxial growth on the substrate crystal.

Since the small solid crystals contain a large amount of the element having a great segregation coefficient, and since the decrease of the amount of this element in the solution, which takes place as the crystal growth on the substrate crystal proceeds, is compensated by dissolution of the small solid crystals, the concentration of the element in the solution is maintained at an almost constant level. One can thus obtain an epitaxial layer of homogeneous composition with respect to the mixing ratio as well as to the impurity concentration.

However this method in which a temperature gradient is formed in a solution for crystal growth has a great disadvantage in that it is difficult to obtain a thick epitaxial layer several millimeters thick, because it is otherwise desirable to keep the amount of small solid crystals in the solution small. When the amount of small solid crystals in the solution is too great, a part of them can be present in the neighborhood of the substrate crystal and they form recesses on, or are attached to, the surface of the substrate crystal. Since the amount of small solid crystals must increase with increasing thickness of the epitaxial layer to be grown, it is difficult to obtain a thick epitaxial layer having a flat surface by this method.

SUMMARY OF THE INVENTION

The object of this invention is to provide a method for crystal growth having none of the disadvantages described above and enabling a uniform epitaxial layer with respect to the mixing ratio as well as to the impurity concentration to be obtained.

In order to achieve the above object, the method for crystal growth according to this invention is realized as follows. After having heated a solution for crystal growth of a III–V compound semiconductor crystal to a temperature higher than the temperature at which a crystal begins to grow on a substrate crystal and, having maintained that temperature, for an appropriate period of time, the solution is cooled to the temperature for crystal growth so that small solid crystals are formed. Then the solution is brought into contact with a substrate crystal through a filter means, such as a mesh and a slit. Between the filter means and the substrate crystal a space of appropriate size is provided. A part of the solution is filtered by the filter means and drains itself into this space. This part of the solution contains no small solid crystals, because the small solid crystals remain in the part of the solution above the filter means. Consequently, at this moment, the whole system for crystal growth can be represented by the substrate crystal, the part of the solution containing no small solid crystals, and the part of the solution containing small solid crystals. At the latest before this contact step, a temperature gradient should be formed so that the temperature is lowest at the position of the substrate crystal and increases toward the upper surface of the solution. A part of the small solid crystals is dissolved, and the resulting solute passes through the filter means and diffuses toward the substrate crystal to participate in the formation of the epitaxial layer on the substrate crystal.

One of the most important advantages of this method is that the small solid crystals can be stored in quantity and that, because the small solid crystals are well separated from the substrate crystal by the filter means, it is possible to obtain thick epitaxial layer without the surface irregularities of the substrate crystal due to the presence of small solid crystals in the neighborhood of the substrate crystal which are a drawback of the traditional method.

It should be understood that there may be various modifications and changes, as indicated below, in the method of this invention. Instead of only one substrate crystal and one solution for crystal growth, one can also utilize a plurality of substrate crystals as well as a plurality of solutions. The substrate crystal may be brought into contact with a plurality of solutions successively. It is also possible to carry out epitaxial growth simultaneously or successively on a plurality of substrate crystals. Furthermore, the relative position of the substrate crystal, the solution and the filter means before the beginning of crystal growth, the method for moving parts of the apparatus for crystal growth, and in particular the shape of jigs of the apparatus are not at all critical, but can be arbitrarily selected.

This invention will be described in more detail hereinbelow, referring to several preferred embodiments.

DESCRIPTION OF THE PREFERRED EMBODIMENTS

EMBODIMENT 1

Figure 1A:
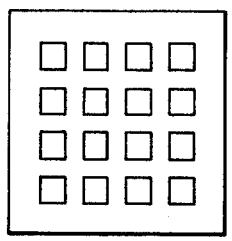
FIGS. 1A, 1B, and 1C are top views of various filter means which can be used in the crystal growth apparatus according to the invention.
Figure 1B:
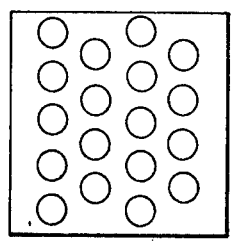
Figure 1C:
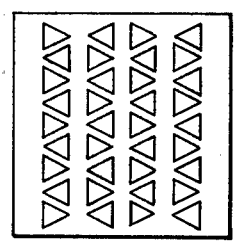
Figure 2:
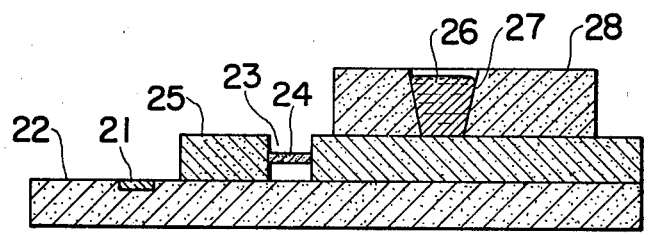
FIGS. 2, 3, 4 and 5 are sectional views of various apparatus according to the invention.

An epitaxial layer of $Ga_{1-x}Al_xAs$ (x representing a mixing proportion of Al wherein $1 > x > 0$) was grown, using an apparatus made of graphite as shown in FIG. 2. The apparatus consisted of a base part 22 on which a substrate crystal 21 is located, a first slider 25 having a well 23 at the upper part of which a mesh 24 is mounted, and a second slider 28 having a well 27 which can hold a solution 26. As the mesh 24, a square-shaped plate 2 cm wide and 1 mm thick, made of graphite, having a plurality of identical perforations is used. However, the plate can have any shape and any thickness. The perforations can also have any shape, but the shape is preferably nearly a circle, an equilateral triangle or an equilateral polygon. The longest straight line segment which can be traced in each perforation should be from 1 to 5 mm. The solution cannot pass through smaller perforations than this lower limit due to its surface tension and larger perforations than this upper limit cannot serve as filter. Three types of mesh are illustrated in FIGS. 1A, 1B and 1C. The base part 22 is 35 cm long, 3 cm wide and 1.5 cm thick. The first slider is 25 cm long while its width and thickness are identical to those of the base part 22.

The second slider is 15 cm long, 3 cm wide, and 2 cm thick. The mesh is so mounted that the space between the mesh and the substrate crystal is 10 mm. A square-shaped GaAs wafer 300 μm thick and 1.5 cm wide with a {100} surface was used as the substrate. In well 27 of the second slider 28 is placed a solution consisting of Ga(30g) as solvent, and Al(70 mg) and GaAs (4g), as solute as indicated in FIG. 2.

The whole system thus mounted was placed in a quartz tube having a rectangular cross section. After having purged the quartz tube of air using $H_2$ gas, it was heated to a temperature of from 950° to 1000°C by means of 2 electric heaters placed above and below the tube. The system was cooled so that the temperature of the substrate crystal reached from 850° to 950°C which is the temperature for crystal growth, after 30 minutes. The temperature of the substrate crystal and other parts of the apparatus was measured by means of thermocouples. These are omitted from FIG. 2 for the sake of simplicity. The temperature gradient was such that the temperature difference in the vertical direction was from 5° to 30°C for every 1 cm. During the cooling process many small crystals were generated in the solution 26. The total weight of the crystals is preferably between 5 and 50% with respect to the total weight of the solute. The second slider 28 was moved toward the left by means of an operation rod, which is not indicated in FIG. 2, until well 27 was just above well 23. A part of the solution 26 drained itself into well 23. Since the small crystals in the solution 26 remained in well 27 because of the presence of the mesh 24, 2 phases, one containing no solid particles and another containing solid particles, were contiguous to each other through the mesh 24. Then, the first slider 25 was moved toward the left together with the second slider 28, until well 23 was just above the substrate crystal 21, so that the solution in well 23 was brought into contact with the substrate crystal 21 and a crystal growth began on the substrate crystal 21. After having kept the system for crystal growth in this state 20 hours it was cooled to room temperature. The sample was then removed from the apparatus. It was observed that a $Ga_{1-x}Al_xAs$ layer about 1 mm thick had grown on the substrate crystal. The mixing proportion, i.e. $x = 0.2$ to $0.4$ was uniform over the entire layer and no irregularities were observed on the surface of the epitaxially grown layer.

EMBODIMENT 2

Figure 3:
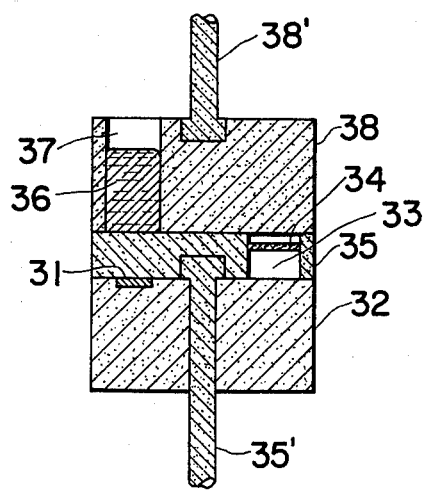

An epitaxial growth of GaAs was carried out by using the apparatus shown in FIG. 3. The apparatus made of graphite has a cylindrical shape with a diameter of 7 cm. The substrate crystal 31 was positioned in a recess formed on the upper surface of the base part 32, which was 5 cm thick. The first slider, 1.5 cm thick, had a well 33 in which a mesh 34 was mounted. The second slider 38, 5 cm thick, had a well 37 in which a solution 36 was placed.

The space between the mesh 34 and the substrate was 10 mm. The sliders 35 and 38 were rotated by means of operation rods 35' and 38' respectively. Epitaxial growth was carried out just as indicated in Embodiment 1. A square shaped wafer of GaAs 300 μm thick and 1.5 cm wide was used as a substrate crystal 31 and a GaAs layer was epitaxially grown on a {100} surface of the wafer. The solution for crystal growth 36 consisting of Ga(30g), GaAs (5g), and Zn(150 mg) was placed in well 37. The whole system thus composed was placed in a cylindrical reaction tube filled with $H_2$ and heated to a temperature of 950°C. by means of electric heaters. The system was then cooled to a temperature of 900°C in 30 minutes and small crystals containing Zn as an impurity were generated in the solution 36. The second slider 38 was rotated by means of an operation rod 38' until well 37 was just above well 33. The solution 36 was filtered by mesh 34 and a part of it drained itself into well 33 so that small crystals remained above the mesh 34. Then the first slider 35 was rotated together with the second slider 38 by means of an operation rod 35' until well 33 was just above the substrate crystal 31 and a GaAs crystal began to grow on the substrate crystal.

Before this step of the process, a temperature gradient of 10°C/cm was formed so that the temperature increased upward toward the surface of the solution. The thermocouples used for temperature measurement are not indicated in the figure for the sake of simplicity. After having kept the system for crystal growth for 20 hours in the above state, it was cooled to room temperature. Then the sample was removed from the apparatus. It was observed that the concentration of the dopant Zn was $1 \times 10^{18}$ cm$^{-3}$ and that it was uniform. According to the traditional crystal growth process the concentration of the dopant should have decreased rapidly in the direction of growth because of intense vaporization of Zn. According to this invention this decrease of Zn doesn't take place, because Zn is supplied by small crystals and the decrease of Zn in the solution due to vaporization is limited. The surface of the layer thus grown was perfectly flat and of high quality.

EMBODIMENT 3

Figure 4:
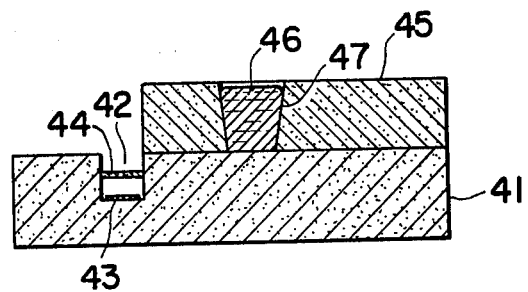

An epitaxial growth of $Ga_{1-x}Al_xAs$ was carried out by using the apparatus indicated in FIG. 4, which is a simplified version of that indicated in FIG. 2. The base part 41 has a well in the bottom of which a substrate crystal 43 is located while at the same time a mesh 44 is mounted in the upper part. In the figure, the reference numeral 45 indicates a slider having a well 47 in which a crystal growth solution 46 is placed. The process for crystal growth using this apparatus is almost identical to that carried out using the apparatus indicated in FIG. 2 (Embodiment 1). The slider 45 is moved toward the left using an operation rod (not indicated in the figure) and a part of the solution 46 drains itself into well 42 formed in the base part 41 through the mesh 44. The crystal growth process was carried out under the same conditions with respect to starting materials, substrate crystal, temperature, time, etc. as those indicated in Embodiment 1, and identical results, including an epitaxial layer of high quality, were obtained.

EMBODIMENT 4

Figure 5:
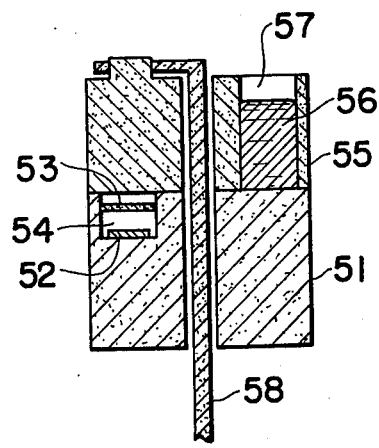

The apparatus shown in FIG. 5 is to that shown in FIG. 3 what the apparatus shown in FIG. 4 is to that shown in FIG. 2. That is, a base part 51 has a well 54 in which both a substrate crystal 52 and a mesh 53 are mounted. A slider 55 has a well 57 in which a solution 56 is placed. The slider 55 is rotated by means of an operation rod 58 so that a part of the solution 56 drains itself into well 54 formed in the base part 51 through the mesh 53. Procedures for crystal growth by means of this apparatus are rather simplified versions of those described in Embodiment 2. Therefore they are not described here. The crystal growth process was carried out under the same conditions as those described in Embodiment 2 and an epitaxial GaAs layer of high quality was obtained.

EMBODIMENT 5

The epitaxial growth processes described in Embodiments 1 to 4 were repeated by varying the distance between the substrate crystal and the mesh. When the distance was smaller than 1 mm, no uniformly grown layer could be obtained. This is because the solution cannot drain itself into the space between the mesh and the substrate crystal due to the surface tension of the solution. Consequently the distance between the mesh and the substrate crystal should be greater than 1 mm. Satisfactory results were obtained in every case when the distance was greater than 1 mm. However, too great a distance is disadvantageous, because it necessitates an unnecessarily great amount of solution. Therefore the distance should preferably be between 1 and 10 mm.

EMBODIMENT 6

An epitaxial layer of $GaAs_{1-x}P_x$ (x representing a mixing proportion of P wherein $0.2 < X < 0.4$) was grown, using an apparatus made of graphite as shown in FIG. 2 and by following the procedure of Embodiment 1. In this case, however, in well 27 of the second slider 28 is placed a solution consisting of Ga(30g), GaP(3g) and GaAs(4g).

When a sample was removed from the apparatus, it was observed that a $GaAs_{1-x}P_x$ layer about 1 mm thick had grown on the substrate crystal of the GaAs wafer. The mixing proportion, i.e. $x = 0.2$ to $0.4$ was uniform over the entire layer and no irregularities were observed on the surface of the epitaxially grown layer.

As indicated above, according to the method of this invention, it is possible to obtain epitaxial layers having a constant mixing proportion and its constituent elements or uniformly distributed impurities. Moreover, since fluctuations in the thickness of the layers grown by traditional processes, which is one of the most important drawbacks of traditional epitaxial growth processes, are largely reduced, the yield rate of fabrication for light emitting diodes can be increased.

In the above embodiments the method for crystal growth according to this invention was described for only $Ga_{1-x}Al_xAs$, $GaAs_{1-x}P_x$, and GaAs. However, it should be understood that this method can be applied to other III–V compound semiconductors as well, such as GaP, InP, InAs, and their mixed crystals. The shape of apparatus is not limited to that shown in FIGS. 2, 3, 4 and 5, but many modifications and changes can be added thereto without departing from the spirit of this invention.

What is claimed is:

1. A method for crystal growth, in which a semiconductor crystal is grown in a liquid phase on a substrate crystal, which comprises:
   1. preparing a solution for crystal growth comprising a III–V compound semiconductor material containing a predetermined amount of solute which is to be grown,
   2. heating said solution to a temperature which is higher than the temperature of crystal growth,
   3. cooling said solution to said temperature of crystal growth, whereby a part of said solute crystallizes out as small crystals,
   4. separating said solution for crystal growth into two parts, one of which contains said crystals and the other of which does not by initially placing said solution in a first well, by positioning said first well over a second well having filter means through which only liquid can pass adjacent to its upper portion and by allowing said crystals to form in the solution while it is contained in said first well and thereafter allowing liquid in the solution to pass through said filter means into the second well,
   5. bringing said substrate crystal into contact with the part of said solution for crystal growth containing no crystals in said second well and
   6. forming a temperature gradient, at the latest before said step of bringing said substrate crystal into contact with the part of said solution for crystal growth containing no crystals, whereby the temperature increases in an upward direction from the substrate crystal to the upper surface of the solution for crystal growth.

2. A method according to claim 1, wherein said III–V compound semiconductor material includes $GaAs_{1-x}P_x$, $Ga_{1-x}Al_xAs$ wherein $1 > x > 0$ and GaAs.

3. A method according to claim 1 in which said semiconductor substrate is a III–V compound semiconductor.

4. A method according to claim 1, wherein the temperature to which the solution is heated is in the range of from 950° to 1000°C and the temperature to which the solution is cooled is from 850° to 950°C for $Ga_{1-x}Al_xAs$ or $GaAs_{1-x}P_x$ wherein $0.4 > x > 0.2$.

5. A method according to claim 1, wherein the part of the solute crystallized out as small crystals comprises from 5 to 50% by weight of said solute.

6. A method according to claim 1, wherein said temperature gradient ranges from 5° to 30°C/cm.

* * * * *